(12) United States Patent
Gupta

(10) Patent No.: US 10,901,950 B2
(45) Date of Patent: *Jan. 26, 2021

(54) EFFICIENT DATA COMPRESSION AND ANALYSIS AS A SERVICE

(71) Applicant: Amazon Technologies, Inc., Seattle, WA (US)

(72) Inventor: Anurag Windlass Gupta, Atherton, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/943,623

(22) Filed: Apr. 2, 2018

(65) Prior Publication Data

US 2018/0225299 A1 Aug. 9, 2018

Related U.S. Application Data

(63) Continuation of application No. 15/199,627, filed on Jun. 30, 2016, now Pat. No. 9,934,235, which is a
(Continued)

(51) Int. Cl.
*G06F 16/00* (2019.01)
*G06F 16/174* (2019.01)
(Continued)

(52) U.S. Cl.
CPC ......... *G06F 16/1744* (2019.01); *G06N 20/00* (2019.01); *H03M 7/30* (2013.01); *H03M 7/3079* (2013.01); *H03M 7/6088* (2013.01)

(58) Field of Classification Search
None
See application file for complete search history.

(56) References Cited

U.S. PATENT DOCUMENTS 6,236,341 B1 5/2001 Dorward et al.
6,778,291 B1 * 8/2004 Clouthier ............... H04N 19/12
358/1.15
(Continued)

FOREIGN PATENT DOCUMENTS

EP 1393517 A2 3/2004
EP 1578019 9/2005
(Continued)

OTHER PUBLICATIONS

Office Action from Japanese Patent Application No. 2017-235744, dated Nov. 27, 2018, pp. 1-9.
(Continued)

*Primary Examiner* — Son T Hoang
(74) *Attorney, Agent, or Firm* — Robert C. Kowert; Kowert, Hood, Munyon, Rankin & Goetzel, P.C.

(57) ABSTRACT

Data may be efficiently analyzed and compressed as part of a data compression service. A data compression request may be received from a client indicating data to be compressed. An analysis of the data or metadata associated with the data may be performed. In at least some embodiments, this analysis may be a rules-based analysis. Some embodiments may employ one or more machine learning techniques to historical compression data to update the rules-based analysis. One or more compression techniques may be selected out of a plurality of compression techniques to be applied to the data. Data compression candidates may then be generated according to the selected compression techniques. In some embodiments, a compression service restriction may be enforced. One of the data compression candidates may be selected and sent in a response.

17 Claims, 9 Drawing Sheets

Related U.S. Application Data continuation of application No. 13/900,350, filed on May 22, 2013, now Pat. No. 9,384,204.

(51) Int. Cl.
  *G06N 20/00* (2019.01)
  *H03M 7/30* (2006.01)

(56) References Cited

U.S. PATENT DOCUMENTS

| | | | |
|---|---|---|---|
| 6,779,040 B1* | 8/2004 | Lee | G06T 9/00 382/250 |
| 7,024,414 B2 | 4/2006 | Sah et al. | |
| 7,860,843 B2 | 12/2010 | Dodd et al. | |
| 7,966,343 B2 | 6/2011 | Yang et al. | |
| 8,327,026 B1 | 12/2012 | Tripathi et al. | |
| 9,384,204 B2 | 7/2016 | Gupta | |
| 9,934,235 B2 | 4/2018 | Gupta | |
| 2003/0034905 A1* | 2/2003 | Anton | H03M 7/30 341/51 |
| 2004/0024662 A1 | 2/2004 | Gray et al. | |
| 2005/0210151 A1* | 9/2005 | Abdo | H03M 7/30 709/247 |
| 2006/0294125 A1* | 12/2006 | Deaven | H04N 19/46 |
| 2007/0098286 A1 | 5/2007 | Kotoda | |
| 2007/0109153 A1* | 5/2007 | Ma | H03M 7/3086 341/50 |
| 2008/0098083 A1* | 4/2008 | Shergill | G06F 11/1453 709/217 |
| 2008/0263074 A1 | 10/2008 | Bissett et al. | |
| 2009/0232480 A1* | 9/2009 | Jendbro | G11B 27/034 386/224 |
| 2010/0030748 A1 | 2/2010 | Netz et al. | |
| 2010/0074321 A1* | 3/2010 | Beaudreau | H04N 19/115 375/240.01 |
| 2010/0278446 A1 | 11/2010 | Ganesh et al. | |
| 2010/0281079 A1 | 11/2010 | Marwah et al. | |
| 2011/0022812 A1 | 1/2011 | van der Linden et al. | |
| 2011/0029569 A1 | 2/2011 | Ganesh et al. | |
| 2011/0038287 A1 | 2/2011 | Agarwal et al. | |
| 2011/0103703 A1* | 5/2011 | Karlov | H03M 7/48 382/239 |
| 2011/0167173 A1 | 7/2011 | Bansal et al. | |
| 2011/0173161 A1 | 7/2011 | de la Torre et al. | |
| 2011/0199241 A1 | 8/2011 | Torii | |
| 2011/0219020 A1 | 9/2011 | Oks et al. | |
| 2011/0246621 A1 | 10/2011 | May, Jr. et al. | |
| 2011/0257819 A1* | 10/2011 | Chen | G01S 5/0027 701/21 |
| 2011/0307521 A1 | 12/2011 | Slezak et al. | |
| 2011/0320417 A1 | 12/2011 | Luo et al. | |
| 2012/0017010 A1 | 1/2012 | Chauhan | |
| 2012/0026288 A1 | 2/2012 | Tourapis et al. | |
| 2012/0039534 A1 | 2/2012 | Malik et al. | |
| 2012/0054225 A1 | 3/2012 | Marwah et al. | |
| 2012/0089579 A1 | 4/2012 | Ranade et al. | |
| 2012/0143913 A1 | 6/2012 | Beier et al. | |
| 2012/0265737 A1 | 10/2012 | Potkonjak | |
| 2012/0284239 A1 | 11/2012 | Agarwala et al. | |

FOREIGN PATENT DOCUMENTS

| | | |
|---|---|---|
| JP | 2004112497 | 4/2004 |
| JP | 2005-293224 | 10/2005 |
| JP | 2005288157 | 10/2005 |
| JP | 2007043673 | 2/2007 |
| JP | 2012039198 | 2/2012 |
| WO | 2011129818 | 10/2011 |

OTHER PUBLICATIONS

Office Action from Canadian Application No. 2995620, dated Dec. 17, 2018, Amazon Technologies, Inc., pp. 1-4.

U.S. Appl. No. 13/747,169, filed Jan. 22, 2013, Stefano Stefani.

ACM, Dominik Slezak, Jakub Wroblewski, Victoria Eastwood, Piotr Synak, Brighthouse: An Analytic data Warehouse for Ad-hoc Queries, Aug. 2008, pp. 1337-1345, Proceedings of the VLDB Endowment vol. 1 Issue 2.

ACM, Daniel Abadi, Samuel Madden, Nabil Hachem, ColumnStores vs. RowStores: How Different Are They Really?, Jun. 2008, pp. 967-980, Proceedings of the 2008 ACM SIGMOD International Conference on Management of Data.

Nicolas Bruno, Teaching an Old Elephant New Tricks, Jan. 2009, Proceedings of the Conference on Innovative Data Systems Research (CIDR) pp. 1-6.

Wilshire Conferences, William McKnight, Best Practices in the Use of Columnar Databases, Aug. 2011, available at http:/fwww.wilshireconferences.com/NoSQL2011/WP/Calpont%20Whitepaper.pdf pp. 1-12.

International Search Report and Written Opinion from PCT/US14/39209, dated Sep. 24, 2014, Amazon Technologies, Inc., pp. 1-13.

Extended European Search Report from Application No. PCT/US2014039209, dated Jan. 30, 2017, pp. 1-11, Amazon Technologies, Inc.

Carrillo, P., et al., "Low Complexity H.264 Video Encoder Design Using Machine Learning Techniques," 2010 Digest of Technical Papers/International Conference on Consumer Electronics, IEEE, Jan. 9, 2010, pp. 461-462, XP031640902, ISBN: 978-1-4244-4314-7.

Office Action from Japanese Patent Application No. 2016-515098, dated Feb. 14, 2017 (English translation and Japanese version), pp. 1-7.

Office Action and Search Report from Chinese Application No. 201480037286.9, dated Jan. 31, 2018 (English translation and Chinese version), Amazon Technologies, pp. 1-11.

Office Action from European Application No. 14801505.0, (Amazon Technologies, Inc.), dated Feb. 14, 2019, pp. 1-8.

Office action from Canadian Application No. 2913142, dated Sep. 17, 2020, pp. 1-4.

\* cited by examiner

EFFICIENT DATA COMPRESSION AND ANALYSIS AS A SERVICE

This application is a continuation of U.S. patent application Ser. No. 15/199,627, filed Jun. 30, 2016, now U.S. Pat. No. 9,934,235, which is a continuation of U.S. patent application Ser. No. 13/900,350, filed May 22, 2013, now U.S. Pat. No. 9,384,204, which are hereby incorporated by reference herein in their entirety.

BACKGROUND

As the technological capacity for organizations to create, track, and retain data continues to grow, a variety of different technologies for transmitting and storing the rising tide of information have been developed. One such technology, data compression, allows for the reduction of data size by representing the data differently. At a later time, data may be restored for further processing. Many different types of data may be compressed according to many different compression techniques. Determining which compression technique to apply is often challenging. Some techniques are more effective, generating a greater reduction in data size, for some data, while for other data a different compression technique may be better suited. Often the ability to select a compression technique to apply to data may be limited by the resources required to perform various analyses on the data within the constraints of the entity that wishes to compress the data. Similarly, different compression techniques impose differing burdens to perform the compression technique. Thus, entities who wish to compress data are often limited by time, operational costs, and other compression selection criteria source limitations to efficiently compress data.

Figure 1:
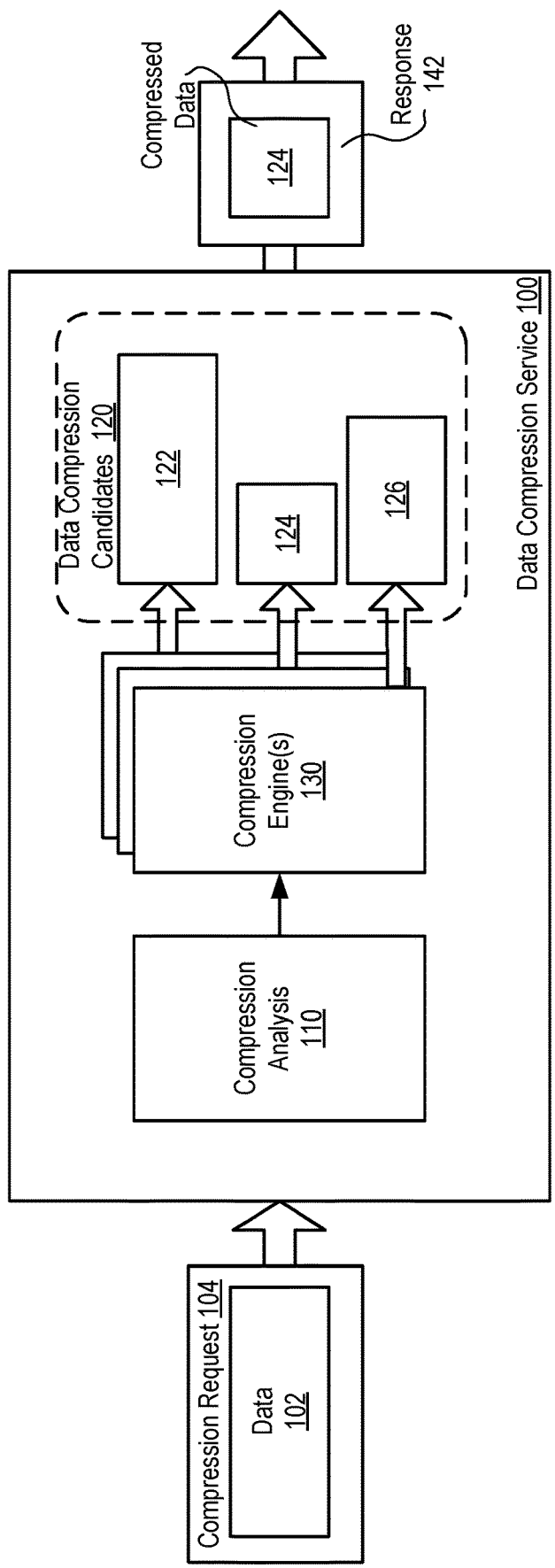
FIG. 1 illustrates a dataflow block diagram of efficient data compression and analysis as a service, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

In the following detailed description, numerous specific details are set forth to provide a thorough understanding of claimed subject matter. However, it will be understood by those skilled in the art that claimed subject matter may be practiced without these specific details. In other instances, methods, apparatus, or systems that would be known by one of ordinary skill have not been described in detail so as not to obscure claimed subject matter.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the scope of the present invention. The first contact and the second contact are both contacts, but they are not the same contact.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Various embodiments of efficient data compression and analysis as a service are described herein. A compression request may be received from a client (e.g., a client system, service, device, user, etc.) including data to be compressed. A rules-based analysis may be performed on the data to be compressed or metadata associated with the data in order to select one or more compression techniques out of a plurality of compression techniques to be applied to the data. Data compression candidates may be generated according to the selected compression techniques. A compression service restriction may be enforced that bounds the generation of compression data objects. One of the data compression candidates may then be selected according to a compression selection criteria and sent as the requested compressed data.

The specification first describes an example of efficient data compression and analysis. A compression service, such as a compression service implemented as part of various web services, may be configured to implement efficient data compression and analysis. Included in the description of the example compression service are various aspects of the compression service as well as various other services with which a compression service may interact, such as a database service. The specification then describes flowcharts of various embodiments of methods for efficient data compression and analysis as a service. Then, the specification describes an example system that may implement the disclosed techniques. Throughout the specification a variety of different examples may be provided.

Data may be created, generated, transmitted, managed, modified, stored, or otherwise manipulated for many different reasons. It is not uncommon for those entities (e.g., customers, organizations, users, clients, systems, etc.) to compress this data in order to more efficiently, store, transport, or otherwise manage the data. Media organizations, for example, may create audio or visual files for distribution to consumers. Compressed versions of these audio or visual files may be sent to consumers, as they are smaller and may be more easily and quickly transported (e.g., consume less bandwidth). Data storage organizations may maintain large amounts of data for many different storage clients. In order to increase the security and reliability of stored data, multiple copies of data may be maintained. Storing these multiple copies of data in compressed form may consume less storage space, lowering the cost for providing the more reliable storage. Numerous other examples may be considered that also demonstrate the desirability of data compression, and as such the above examples are not intended to be limiting.

However, as the amount of data grows and/or the variety of techniques to compress the data increase, it may become increasingly difficult to perform the most efficient forms of compression upon data. For example, consider the media organization described above. The number of data formats (e.g., file formats, such as mp3, jpeg, mpeg) used to store data continue to expand, as do the various technologies capable of receiving and consuming the data. The burden to select an appropriate compression technique to apply to the data may become more complex, requiring greater resources. Similarly, the example data storage organization above may receive many different types of data susceptible to a variety of different types of compression. Selecting the most efficient compression technique to apply may prove challenging, such as in cases where a new or uncommon type of data to be compressed is received. In these scenarios, and many others, alternative methods and techniques to achieve compressed data may be beneficial.

FIG. 1 illustrates a dataflow block diagram of efficient data compression and analysis, according to some embodiments. Data compression service 100 may be implemented by one or more computing systems or devices, such as one or more nodes of a distributed system, or any other type of computing system or device, such as those described below with regard to computer system 1000 in FIG. 1. A data compression service may be configured to receive compression request 104 including a data 102 from a variety of different systems, devices, or clients. These clients may be other services or systems controlled by a same entity that controls data compression service 100 or controlled by some third party.

Data 102 may be any type of data that may be received at data compression service 100. For example, if data compression service 100 is configured to communicate with compression clients over a network connection, then data compression service 100 may be able to compress any type of data that may be transmitted over such a network connection. Data may be partitioned into one or more separate chunks, packets or other portions, which may be either treated as a whole, or in separate portions. In some embodiments, data 102 may be data that is already compressed according to one or more compression techniques.

Compression analysis 110 may occur to select some compression techniques out of a plurality of different compression techniques to be applied to data 102. Compression analysis may be performed by analyzing data 102. Analysis may include determining various characteristics of the data, such as data type, format, size, or by examining the data for a certain size domain of possible values, or a commonly repeating values. As many different types of data analysis may be performed, the previous examples are not intended to be limiting.

Compression analysis 110 may also be applied by analyzing metadata describing the data to be compressed. Metadata associated with the data to be compressed may also be obtained, according to some embodiments. For example, metadata describing the origin or destination (e.g., client) of the data, the time the data was received (e.g., timestamp), or more generally indicate a type or characteristic of the data. This metadata may be included as a data header in a compression request or other information format that is included with the compression request or data when received at compression service 100. Metadata may also be stored at the compression service that is associated with a particular data type or client, such as a specific client identifier that stores metadata associated with data received from the identified client. Metadata may be descriptive information generated by and received from a client. For example, the metadata may identify that the data may be daily traffic values for a website.

A rules-based analysis of the metadata and/or the data, or some other dynamic analysis technique may be performed, in various embodiments. A rules-based analysis may include a set of rules representing a knowledge base for the compression service. These rules may be determined based on historical data associated with previously compressed data, such as entropy measures for various types of data as well as the one or more compression techniques applied to the data to achieve the recorded entropy measures. Rules-based analysis may include determining data characteristics with which to evaluate data to be compressed and then identifying a set of compression selection rules to be applied to the known information about the data, such as obtained earlier through the previous data analysis of the data and metadata, to select one or more compression techniques to be applied to the data. In at least some embodiments these compression techniques may be ordered in a particular sequence. In some embodiments, compression techniques may be applied in parallel, such as by multiple nodes or computing devices each working to apply a different compression technique to generate data compression candidates.

In at least some embodiments, machine-learning may also be applied, as part of compression analysis 110, to update the knowledge base of data compression service 100. For example, a supervised-learning technique may apply a supervised learning technique to historical compression data that have one or more similar data characteristics to the data characteristics of the data to be compressed. A current set of compression selection rules applied to the data to be compressed in a rules-based analysis of data may be updated, modified, or altered as a result of this machine-learning technique. For instance, a certain compression technique may be given a higher priority for the data than would have previously been given under the unmodified set of rules to be applied.

Multiple different compression engines 130 may be configured to perform one or more compression techniques to generate data compression candidates 120. These compression engines may compress the data to be compressed according to the selected one or more of compression techniques. In at least some embodiments, compression engines 130 may be configured to compress the data according to a particular sequence of compression techniques in accordance with a given compression service restriction. A compression service restriction may limit the time, cost, or provide some other bound toward the generation of candidate compression data objects. For instance, the selected one or more compression techniques may be given an order of priority, with those compression techniques most likely to perform the most efficiently ordered before those compression techniques of lesser likely efficiency as determined by compression analysis 110. Thus, if a given compression service restriction applies a time limit, data compression candidates may be generated according to the most likely efficient compression techniques within the time limit while those of smaller likelihood to produce efficiently compressed data may or may not be performed within the given time limit. In another example, a service fee, or some other cost may be assigned to work performed by the compression service compress a data object, and the client may request that only a service fee cap be applied to compression of the data. As these two examples are only some of many different types of service restrictions that may be enforce, the previous examples are not intended to be limiting.

In various embodiments, one of the data compression candidates 120 may be selected according to a compression selection criteria. For example, in some embodiments a compression selection criteria may be based on a single measure, such as the size of the data compression candidate. As illustrated in FIG. 1, the data compression candidates 120 for data 102 include candidate 122, 124, and 126. If the compression selection criteria is size, then as illustrated in FIG. 1, data compression candidate 124 may be selected as the requested compressed data to be sent. Other measures, such as the time required to generate the data compression candidate or the number of resources to generate the data compression candidate, may be included as components of the compression selection criteria upon which selections may be based. Selected data compression candidates may be sent as the requested compressed data to a variety of different locations, such as back to the client that submitted the compression request, or to another remote system or entity. Response 142, for instance, may indicate, in some embodiments, the selected compressed data object 124 (or the location of compressed data object 124).

Embodiments of efficient data compression and analysis may be implemented as part of a variety of different services or systems. Data management services, such as database services offered to clients, may also implement data compression services for client data stored within the data management service. A data compression service may be a part of a broader set of web or network-based services offered to both internal and external clients and/or customers, or alternatively as a stand-alone service. In some embodiments, a network-based service may provide one or more fee structures, service plans, or performance options to clients utilizing the data compression service. These fee structures, service plans, or performance options may be for or part of a larger set of network-based services provided to clients. More generally, any system that receives and transmits data from clients to clients and/or other services, systems, or customers may implement various embodiments of efficient data compression and analysis as a service, and thus, the previous examples need not be limiting as to various other systems envisioned.

Implementing a Data Compression Service as a Network-Based Service

Figure 2:
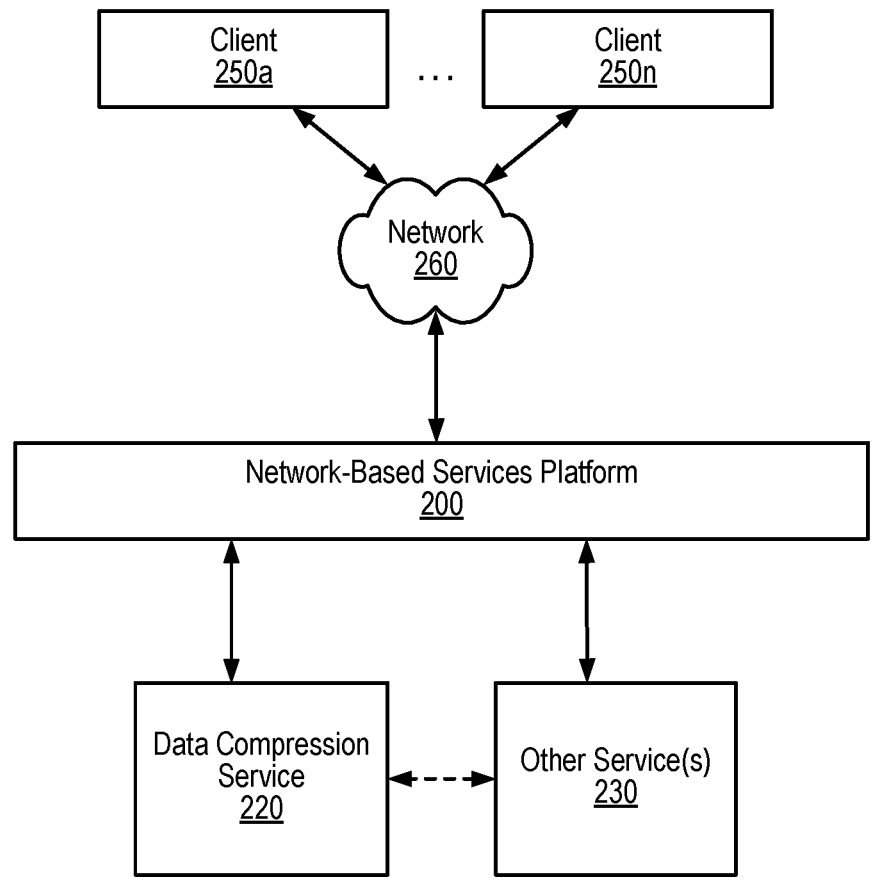
FIG. 2 is a block diagram illustrating an example operating environment for a data compression service, according to some embodiments.

As discussed above, various clients (or customers, organizations, entities, or users) may wish to compress data using a data compression service. FIG. 2 illustrates an example operating environment that may provide data compression services to clients, according to some embodiments. Clients may communicate over a network with a data compression service offered as part of a network-based services platform. Other services implemented as part of the network-based services platform also communicate with and/or obtain services from a data compression service.

Multiple users or clients may send data to be compressed to a data compression service. Clients 250a-250n may include various client systems, users, client applications, and/or data network-based service subscribers, in some embodiments. For example, a client system may include a content provider or data management or storage service. This service may include a system or component configured to route provided content or stored data through a data management service prior to providing the content to a client or other service or process.

A client, such as clients 250a through 250n, may communicate with a data compression service 220 via a desktop computer, laptop computer, tablet computer, personal digital assistant, mobile device, server, or any other computing system or other device, such as computer system 1000 described below with regard to FIG. 9, configured to send requests to the data compression service 220 along with data to be compressed, and/or receive responses from the data compression service 220, such as compressed data. Requests, for example may be formatted as a message that includes parameters and/or metadata associated with data to be compressed by a data compression service 220. Such a message may be formatted according to a particular markup language such as Extensible Markup Language (XML), and/or may be encapsulated using a protocol such as Simple Object Access Protocol (SOAP). Application programmer interfaces (APIs) may be implemented to provide standardized message formats for clients, such as for when clients are communicating with data compression service 220.

In at least some embodiments, clients 250a through 250n may communicate with data compression service 220 as part of communicating with network-based services platform 200. Network-based services platform 200 may offer one or more services to clients 250a-250n including data compression service 220 and other services 230, which may include various hosting, storage, computational, and other services. In at least some embodiments network-based services may include cloud-based services. Network-based services platform 200 may include, track, or store various client accounts whereby client's various fees, fee structures, records of use, and other information concerning client interaction with network-based services, such as data compression service 220 and other services 230 may be retained. In at least some embodiments, network-based services platform 200 may operate as an interface between clients 250a-250n, while in other embodiments, clients 250a-250n may communicate directly with the respective services.

Clients 250a-250n may communicate with data compression service 220 other services 230 or network-based services platform 200 using a variety of different communication methods, such as over network 260. Network 260 may be a Wide Area Network (WAN) (e.g., the Internet). However, private networks, intranets, and other forms of communication technologies may also facilitate communication between clients and data compression service 220. For example, other services 230 may utilize data compression service 220 to compress, analyze, or decompress data with regard to their own services, and may utilize a private network or communication channel. In some embodiments, a client may assemble a message including a compression request and convey the message to a network endpoint (e.g., a Uniform Resource Locator (URL)) corresponding to the data compression service 230). For example, a client 250a may communicate via a desktop computer running a local software application, such as a web-client, that is configured to send hypertext transfer protocol (HTTP) requests to data compression service 230 over network 260. Responses or other data sent to clients may be formatted in similar ways.

Figure 8:
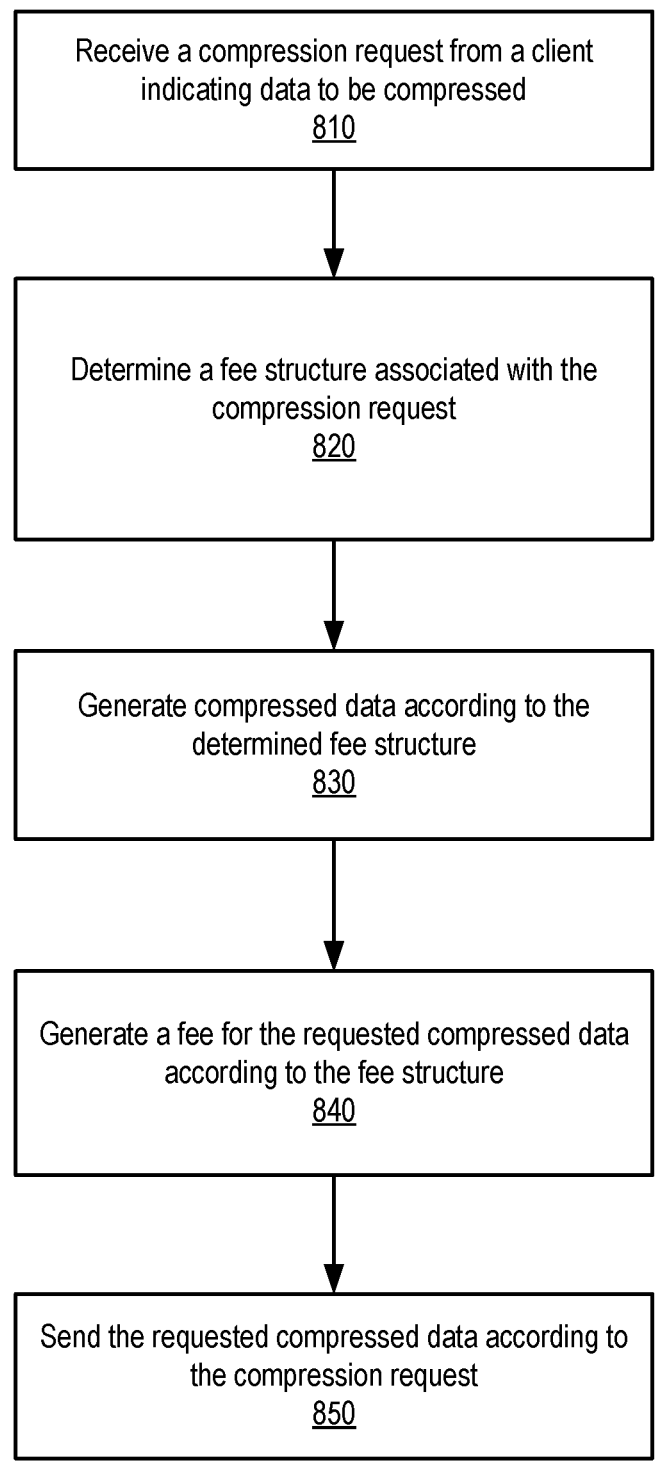
FIG. 8 is a high-level flowchart illustrating a method to perform data compression as a service, according to some embodiments.

As noted above, in at least some embodiments, network-based services platform 200 may operate as an interface for data compression service 220 and/or other services 230. FIG. 8, discussed in further detail below, describes the various methods and techniques to provide a data compression service as a network-based service, according to some embodiments. In some embodiments, compression requests may be received at a network-based service platform 200 from a client indicating data to be compressed. The network-based services platform 200 may determine a fee structure associated with a request. A network-based service platform 200 may direct a data compression service/module, such as data compression service 220 to generate compressed data according to the determined fee structure. A fee may also be generated for the requested compressed data according to the fee structure. The requested compressed data may then be sent according to the compression request.

Figure 3:
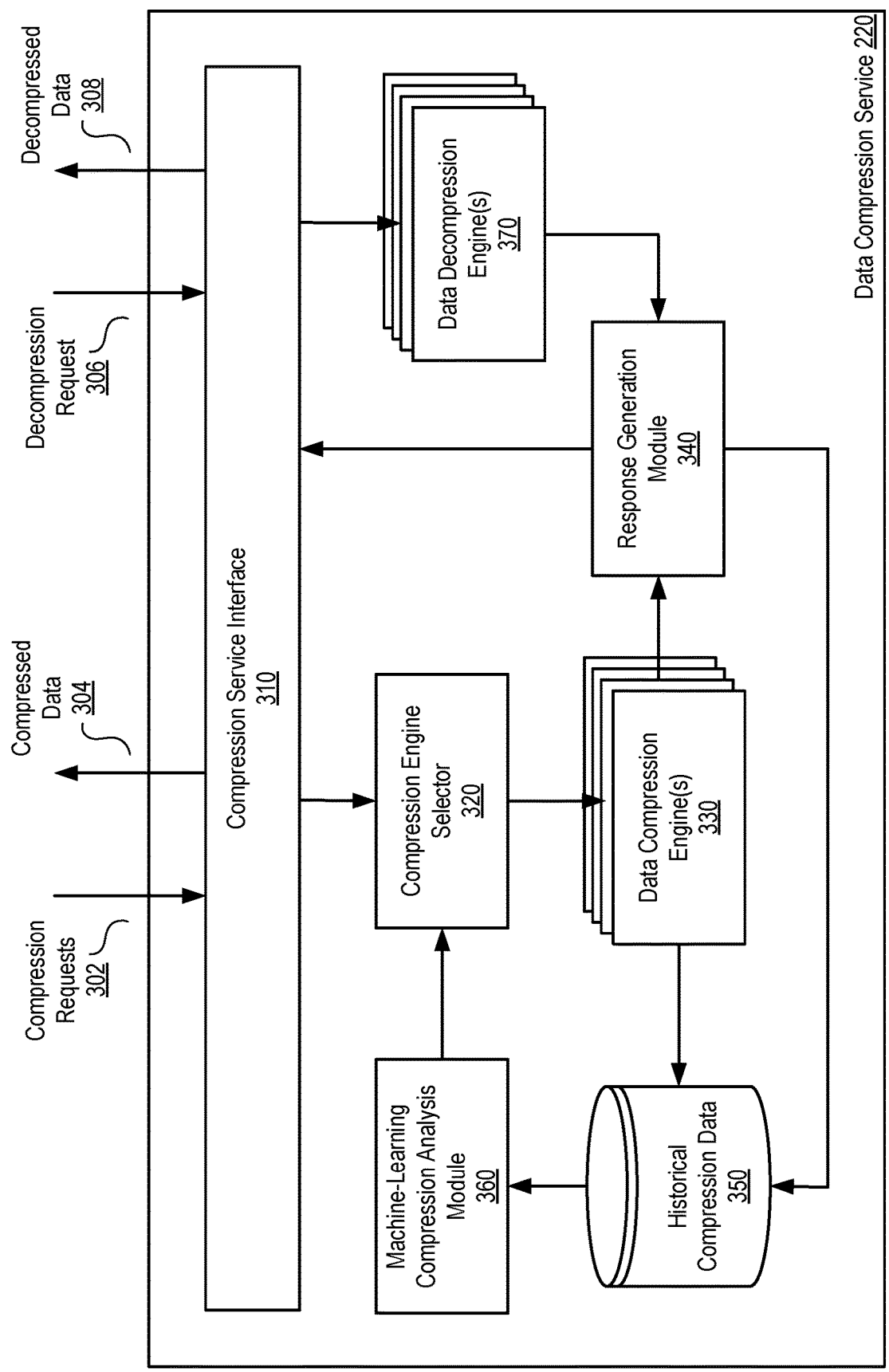
FIG. 3 is a block diagram illustrating an example data compression service, according to some embodiments.

Turning now to FIG. 3, data compression service 220 may be implemented as part of multiple-different network-based services (e.g., web services) or as a stand-alone service. One or more computing systems or devices, such as one or more servers or any other device described below in FIG. 9 with regard to computing system 1000, may be configured to implement data compression service 220. Data compression service may be implemented in a distributed manner where multiple nodes of a distributed system may implement one or more different components of a data compression service 220. For example, one or more nodes may be configured to implement data compression engines 330. In addition to the variety of computing systems or devices, a variety of different other hardware, software, or a combination of hardware and software components may be used to implement the various components illustrated in FIG. 3, and as such, the following description is not intended to be limiting.

Compression requests 302 indicating data to be compressed may be received at data compression service 220 from a variety of different clients. In some embodiments, data may be included with the request, along with the request, or indicated by the request. For instance, a request may indicate another system, service, or storage location from which the data to be compressed may be obtained. The data compression service may then obtain the data from the indicated location for compression. Data compression requests may be, as noted above, formatted in a variety of different ways and according to many different protocols. For example, an API may be used to format compression requests, data to be compressed, various metadata associated with the data, or a compression service restriction for the compression request. Data to be compressed may be of many different types, including, but not limited to, various text data or media data, useful for or by many different users, services, or clients, including, but not limited to, storage services, content providers, communication services (e.g., message or notifications services), etc. . . . . Data to be compressed 302 may be a large data object, or data that is divided in different data chunks. Data 302 may be viewed as a data stream or some other grouping or logical arrangement of associated data (e.g., in one or more data packets that make up the data to be compressed).

Data compression service 220 may, in some embodiments, implement a compression service interface 310 that receives request to compress data and/or the data to be compressed. In some embodiments, compression service interface may be configured to part compression requests and/or provide information obtained from compression requests to one or more other components of data compression service 220 for further processing. For example, compression service interface may provide metadata extracted from a compression request that indicates the type or characteristics of data to be compressed to a compression engine selector 320 to perform a rules-based or some other form of analysis. A client identifier, for instance, linked to a particular client account may be identified by compression service interface 310. Compression service interface 310 may also be configured to perform a variety of different other tasks to implement data compression service 220, such as tracking usage of the service by a particular client, performing various billing, or other fee, cost, or assessment techniques, as well as interacting with other services that may be utilized by a data compression service 220, such as a billing or account management service implemented as part of a network-based services platform 200 in FIG. 2.

A compression engine selector 320 may be implemented in various embodiments as part of data compression service 220. Compression engine selector 320 may be configured to perform one or more analysis techniques upon data to be compressed or metadata associated with the data. For example, in some embodiments, compression engine selector 320 may sample, scan, or review a subset or portion of data to determine one or more data characteristics for the data. These characteristics for the data may include, but are not limited to, data type, format, size, or a certain size domain of possible values, or a set of commonly repeating values. An entropy measure, or some other determination may be made that indicates the variation of data values in the data. Based on this data analysis one or more data characteristics for the data to be compressed may be determined.

Similarly, a various techniques may also be utilized by compression engine selector 320 to obtain metadata associated with the data to be compressed. For instance, the origin of the data to be compressed may be determined, such as by examining a client identifier or other source identifier that may be linked to metadata describing the client (e.g., a retailer, a data management provider, security or encryption service, etc. . . . ). Timing information, such as timestamps of when data is sent or received, descriptive data, such as a domain of data values (e.g., male/female, 50 states, zip codes, age ranges, etc. . . . ), or any other type of data that may be descriptive of the data or the client or recipient of the compressed data (which may or may not be the compression client). As with the data itself, data characteristics for the data may be identified by the compression engine selector 320 and utilized as part of the compression engine selection and/or analysis.

Compression engine selector 320 may be configured to select one or more compression techniques out of a plurality of compression techniques to be applied to the data. Selection of compression techniques may be implemented by performing one or more analytical techniques. For example, in some embodiments a rules-based compression analysis may be performed on the data or metadata (e.g., data characteristics) associated with the data to make this selection. In some embodiments, data characteristics may be identified for the data as part of the metadata and/or the data itself, and a set of compression selection rules may be applied to these data characteristics to determine which compression techniques to select. For example, the set of compression selection rules may determine that for a data characteristic that indicates the domain of data values is limited to 2, an efficient data compression technique to select may be a run-length compression technique. Other rules select different compression techniques based on different data characteristics for the data. In at least some embodiments, compression selection rules may determine an ordering of compression techniques in a particular sequence. This sequence may be ordered by likelihood of compression efficiency based on the rules-based analysis. Compression engine selector 320 may also include a randomly selected or determined compression technique as one of the selected compression techniques to generate candidate compressed data. Randomly selected compression techniques may prevent an analysis, such as rules based analysis, from being overly influenced by the results of similar compression techniques without trying different ones that may or may not produce better compression. For example, in at least some embodiments, the data compression candidates may be used as part of historical data to perform machine learning. Compression candidates generated using a randomly selected compression technique may prevent local minima or other types localized factors that may limited effective machine learning from historical data.

In at least some embodiments, a machine-learning compression analysis module 360 may be implemented as part of data compression service 220. Machine-learning compression analysis module 360 may perform one or more machine-learning techniques on historical compression data 350. In at least some embodiments, historical compression data may include the results of compression techniques for previously received compression requests, as well as the data characteristics for the compressed data. If, for instance, previous requests with similar data characteristics are received, such as from the same client, or type of data, same size of uncompressed or initial data, etc., then machine learning techniques may be used to identify compression techniques that were more successful for a current compression request with similar data characteristics. Supervised learning, unsupervised learning, and/or semi-supervised learning, are some examples of the various machine-learning techniques that may be applied to historical compression data 350. A variety of different data characteristics or other data points associated with the previous compression of multiple other data compression requests may be analyzed using one or more of these techniques to update, modify, or alter a set of compression selection rules applied by compression engine selector 320. For instance, the priority or order in which compression techniques may be applied may be altered based on an observation by the one or more machine learning techniques that the type of data received from Client A is similar to the type of data from Client B, and that a certain compression technique was very effective for Client B's data.

Compression engine selector 320 may direct one or more data compression engines 330 to perform the selected one or more compression techniques to generate data compression candidates. Each of the data compression engines may be configured to apply one or more data compression techniques, such as, not limited to, byte dictionary, text255, text32k, delta, run-length, mostlyn, run-length compression, Lempel-Ziv, Lempel-Ziv-Oberhumer, bzip, or more generally any other form of lossless or lossy data compression technique. Different ones of compression engines 330 may be capable or configured to compress data according to a different one of these compression techniques. In some embodiments, multiple compression techniques may be applied to generate a data compression candidate. For instance, an identified "best" compression technique may be applied to data, and then a secondary common or system-level technique may be subsequently applied to the compressed data to generate multi-level compressed data. Many different compression techniques are well-known to those of ordinary skill in the art and, thus, the previous examples are not intended to be limiting. Data compression engines may be implemented in a distributed manner, such that each compression technique of the selected compression techniques may be applied in parallel or near-parallel. In some embodiments, different compression techniques may also be applied serially or selected for parallel performance according to a particular ordering of compression techniques.

In at least some embodiments, compression engine selector 320 may direct that the one or more data compression engines 330 apply the one or more data compression techniques according to a particular order or sequence. For instance, compression engine selector 320 may send data to be compressed to data compression engines 330 in an order such that they may be generated according to the particular order or sequence. Alternatively, another load balancer, queue manager, node or some other component may place the data to be compressed into different queues for compression on different data compression engines so that the data compression may occur in the particular sequence.

In at least some embodiments, a compression engine selector component 320, or some other component, such as compression service interface 310 or response generation module 330, may be configured to enforce a compression service restriction. A compression service restriction may be any form of rule, cap, resource limit, or boundary that may limit the generation of data compression candidates, or another of the functions or components within data compression service 220, such as the entire service performed for given data. For example, in some embodiments, a compression service restriction may be a time limit or bound. Compression engine selector 320 may be configured to direct the generation of data compression candidates that may be completed within the time limit. Similarly, some other component, such as response generation component 340 may be configured to only select the one or more data compression candidates that meet the time limit or some other data compression restriction, such as those data compression candidates that may be generated within a certain service cap fee. A compression service restriction may also be one or more rules enforced by data compression service 220 to conserve or balance its own resources across large data compression requests or multiple requests from multiple customers. For example, if data received to be compressed is over a certain size, then certain resource limits may be imposed (e.g., such as the number of nodes or data compression engines that may be directed to perform the generation of data compression candidates). As many other different types of restrictions may be envisioned, the previous examples are not intended to be limiting.

Indicators, such as data headers, may be appended to data compression candidates to identify the one or more compression techniques applied to generate the data compression candidate. For example, if the compression technique applied to the data is a dictionary compression, the data values used to index the dictionary compression technique may be stored in a data header to facilitate decompression.

In at least some embodiments, data compression service 220 may also implement a response generation module 340. Response generation module 340 may be configured to select one of the data compression candidates to send as the requested compressed data in a response according to a compression selection criteria. The data compression candidates may be received as input at response generation module. Performance characteristics for the data compression candidates may be determined that indicate the performance of the one or more compression techniques used to generate the data compression candidate. For example, a performance characteristic may indicate that it took 2.7 seconds to generate a data compression candidate. Other performance characteristics may include, but are not limited to, the size of the data compression candidate, the number of resources utilized to generate the data compression candidate (e.g., the number of nodes), a cost or some other service fee that may be assigned to a data compression candidate, or a decompression time/cost (an amount of time or cost (e.g., computational cost) that it takes to decompress an object). The compression selection criteria used to select one of the data compression candidates may be the one of the data compression candidates whose performance characteristics best meet the compression selection criteria. For example, in at least some embodiments, the compression selection criteria may be smallest size. Thus, the data compression candidate with the smallest size as indicated by the performance characteristic may be select as requested data compression to send. In some embodiments, multiple performance characteristics may be used to determine which data compression candidate best meets the compression selection criteria. For example, the compression selection criteria may be the most cost effective data compression. Such a criteria may be applied to determine the size of the data compression candidate divided by the cost to generate the data compression candidate, such as the time to generate or the number of resources used. Thus, in this example a data compression candidate that may have had a small, but not the smallest compression size, but a much faster time to compress may be selected as the compressed data object. Similarly, the size of the data compression candidate may also be analyzed in conjunction with the decompression time, where a slightly less effective compression technique may have a much smaller decompression time, and thus be selected as the compressed data to send.

In at least some embodiments, response generation module 340 may generate or format the selected data compression candidate for transport to the compressed data recipient. One or more encryption techniques may, for instance, be applied to the selected data compression candidate prior to sending. As noted below, other compression techniques, such as a system compression technique may be applied to the selected data candidate as well. Alternatively, in at least some embodiments, another component (not illustrated) may implement a data encryption module or service (e.g., other services 230 in FIG. 2) to which compressed data is sent and encrypted prior to sending on via compression service interface 310. Compression service interface 310 may, for example, receive the formatted compressed data and send the compressed data 304 to the recipient. In some embodiments, the recipient of compressed data 304 may be the client who requested the compressed data. Alternatively, the recipient may be another remote system or service than the compression client. For example, a storage client may first send data to data compression service 220 to be compressed with the intended recipient to be a data storage service to store the compressed data.

Response generation module 340 may, in some embodiments, determine an entropy measure, or some other measure that indicates the variation of data values, of the selected data compression candidate. Based, at least in part, on this entropy measure, response generation module 340 may compress the selected data compression candidate again according to a system compression technique to further compress the data. Such a system compression technique may be any of the one or more compression techniques described above. For example, an entropy threshold may be implemented such that for those select data compression candidates with an entropy measure lower than the entropy threshold, the system compression technique may be applied to generate multi-level compressed data. Alternatively, in at least some embodiments, a system-wide compression technique may be applied to a selected data compression candidate (or the set of data compression candidates) to generate multi-level compressed data.

Historical compression data 350 may be implemented, in some embodiments, as a data store or other form of storage devices or storage services to track, record, or maintain information associated with previous compressions of data. This information may include data characteristics, performance characteristics, or any other data associated with the compression of the compressed data sent to the recipient. In some embodiments, multiple data compression candidates may be generated, and results data and other data characteristics or other performance characteristics associated with the generation of the data compression candidate may be stored in historical data compression 350 in addition to the data characteristics and/or performance characteristics associated with the selected data compression candidate that is sent as the requested compressed data. These data characteristics may be obtained from various other components of data compression service 220, such as from compression engine selector 320, data compression engines 330, response generation module 340, or any other component that obtains data related to the compression of data. Client identifiers may be stored in historical compression data, for example, that indicate characteristics for previous data received from a client, the compression technique applied, and the recipient to whom it was sent. Thus, when other data is received from the same client, compression engine selector 320 may determine that the best technique to apply is the previous compression technique applied, as indicated in historical compression data 350.

In at least some embodiments, decompression request 306 indicating data to be decompressed may be received at data compression service. The data to be decompressed may, in some embodiments, be included in the request, along with request, or indicated by the request, such as by indicating a location, system, or service from which to obtain the data to be decompressed. This decompression request may identify one or more compression techniques applied to generate the compressed data. Compression service interface 310, or some other component, may direct one or more data decompression engines 370 configured to decompress data according to one or more compression techniques to decompress the compressed data 306. Response generation module 340 may then send the decompressed data 308 to a recipient. As noted above, a recipient may or may not be the same remote system or location as the client who requested the decompression.

Although FIGS. 2 and 3 have been described and illustrated in the context of a data compression service offered as part of a set of network-based services, the various components illustrated and described in FIGS. 2 and 3 may be easily applied to other systems that may wish to provide data compression as a service. Moreover, the configuration of components, systems, or devices show are not limiting as to other possible configurations. FIG. 3, for example illustrates a data compression service as one or more functional components or modules, but in some embodiments these components or modules may be distributed in various ways across different computing devices or nodes. As such, FIGS. 2 and 3 are not intended to be limiting as to embodiments of a data compression service.

Workflow of Efficient Data Compression and Analysis as a Service

Figure 4:
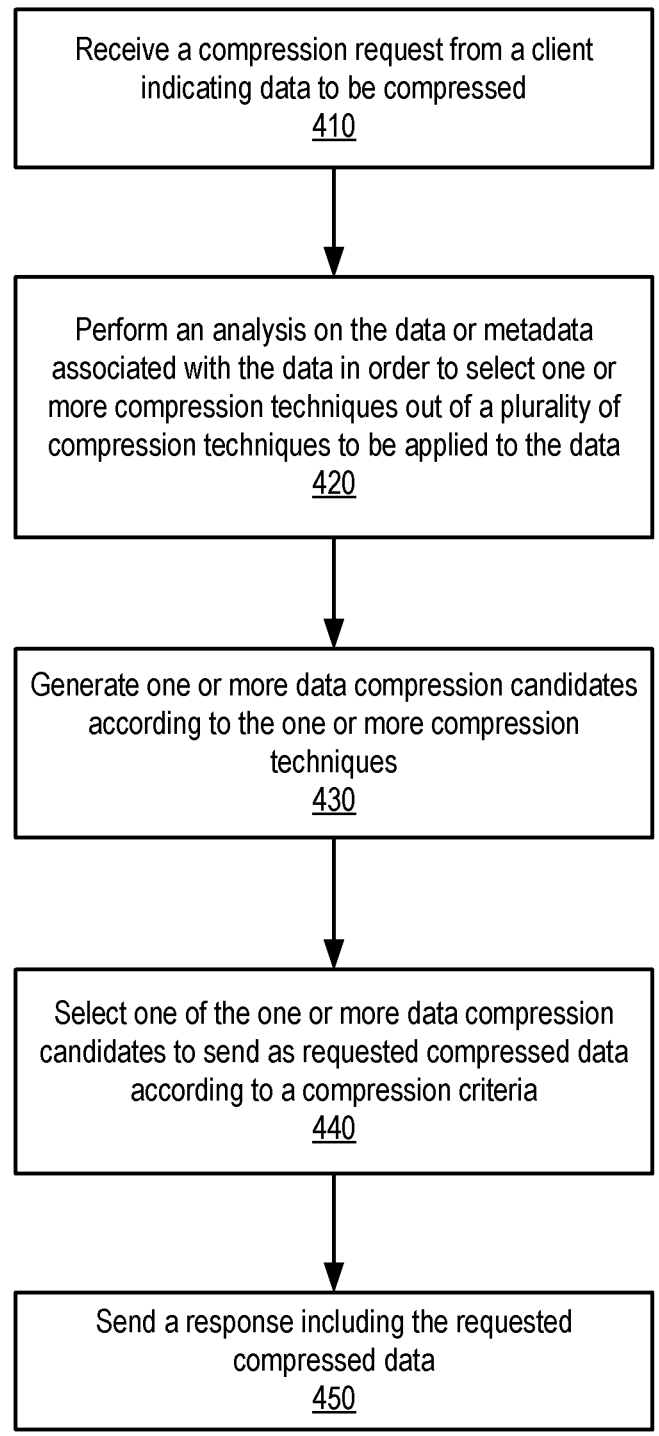
FIG. 4 is a high-level flowchart of a method to perform efficient data compression and analysis as a service, according to some embodiments.

As has been discussed above, a data compression service may provide efficiency benefits more generally to any type of client managing, storing, or transporting data. FIG. 4 is a high-level flowchart of a method to perform efficient data compression and analysis as a service, according to some embodiments. Various different systems and devices may implement the various methods and techniques described below. A data compression service, such as data compression service 220 described above in FIG. 3, may implement the various methods and techniques. However, the above examples and or any other systems or devices referenced as performing the illustrated method, are not intended to be limiting as to other different individuals or configurations of systems and devices.

As indicated at 410, a compression request indicating data to be compressed may be received from a client. This data may be of many different formats, types, sizes, as described above with regard to FIGS. 1 and 3. In some embodiments, data may be included with the request, along with the request, or indicated by the request. For instance, a request may indicate another system, service, or storage location from which the data to be compressed may be obtained. The data compression service may then obtain the data from the indicated location for compression. Metadata may generally indicate a type or characteristic of the data to be compressed, that may be received or obtained. As noted in the examples discussed above with regard to FIGS. 1 and 3, the type/format, identity of the client, origin of the client, timing information about when the data was sent and received may all be examples of metadata associated with the data. Obtaining metadata, for example, may include analyzing or parsing a compression request that may include metadata in a header or some other format or message that includes the data to be compressed. In some embodiments, metadata may be generated specifically for the data using descriptors or other indicators established as part of an API by a data compression service. For instance, a value domain flag may be set that allows a client to identify the number of unique values in the domain of data.

An analysis may be performed on data or metadata associated with the data in order to select one or more compression techniques out of a plurality of compression techniques to be applied to the data, as indicated at 420. The data itself may be analyzed, sampled, scanned, or reviewed, in total or in some subset or portion of data to determine one or more data characteristics for the data. These characteristics for the data may include, but are not limited to, data type, format, size, or a certain size domain of possible values, or a set of commonly repeating values. An entropy measure, or some other determination may be made that indicates the variation of data values in the data may also be determined. Based on data analysis one or more data characteristics for the data to be compressed may be determined. Similarly, as noted above, the metadata associated with the data may also be used to determine data characteristics for the data.

Figure 6:
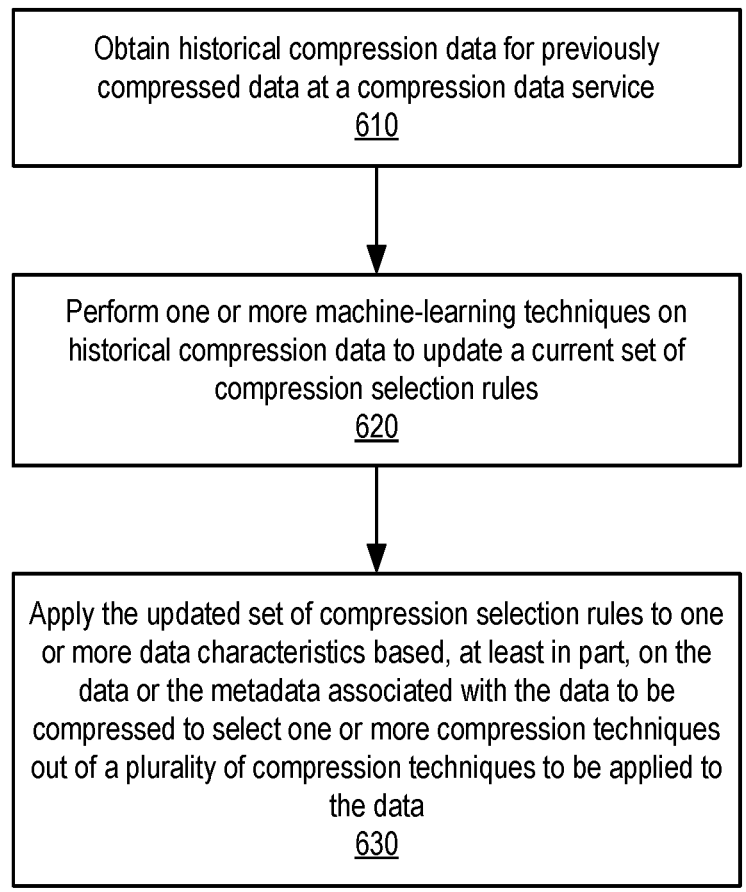
FIG. 6 is a high-level flowchart illustrating a method to perform machine-learning to update a rules-based analysis of data to be compressed, according to some embodiments.

As discussed above with regard to the compression engine selector 320, a rules-based analysis or some other type of analysis may dynamically utilize or apply a knowledge base, such as a set of compression selection rules, to data characteristics for the data to be compressed. The set of compression rules may be applied to the data characteristics for data to be compressed to select one or more compression techniques to be applied. For example, the selection rules may indicate that data composed of a data type, such as integers, may have a one or more efficient compression techniques, and thus the one or more efficient compression techniques would be selected to be applied. Multiple data characteristics may be used when applying compression selection rules. For instance, the type of data values may be used as a filter to narrow the possible compression techniques to a reduced set of possible compression techniques, and then a representation of the distribution of the data in the data may be used to determine a smaller set of compression techniques to be applied. For example, the type of data value may be an integer, limiting compression to a subset of compression techniques, and then the representation of the distribution of the integer values in the data may further refine the subset of compression techniques to a particular set of compression techniques, such as the case where a distribution showing a small range of values might indicate the use of one or more dictionary-based compression techniques. FIG. 6, discussed below, provides further discussion of various machine-learning techniques that may be used to update or adapt rules-based analysis over time. As various implementations of rules-based analysis are well-known to those of ordinary skill in the art, the above examples are not intended to be limiting.

In some embodiments, one or more data compression candidates may be generated according to the one or more selected compression techniques, as indicated at 430. These compression techniques may include any ones of a variety of well-known or lesser known, or customized compression techniques, including, but not limited to, byte dictionary, text255, text32k, delta, run-length, mostlyn, run-length compression, Lempel-Ziv, Lempel-Ziv-Oberhumer, bzip, or more generally any other form of lossless or lossy data compression technique. In some embodiments, multiple compression techniques may be applied to generate a data compression candidate. Many different compression techniques are well-known to those of ordinary skill in the art and, thus, the previous examples are not intended to be limiting. In some embodiments, a compression service restriction, such as those discussed above with regard to FIG. 3, and below with regard to FIG. 5, may be enforced.

One of the one or more data compression candidates may be selected according to a compression selection criteria, as indicated at 440. In some embodiments, A compression selection criteria may be a criteria to select the smallest data compression candidate according to size, or may be some combination of performance characteristics of the data compression, such as the size of the data compression candidate divided by the time or resources used to generate the data compression candidate. Thus, for example, a slightly larger sized data compression candidate may be selected if it takes significantly less time than a smaller compression sized data compression candidate.

The selected data compression candidate may then be sent in a response as the requested compressed data, as indicated at 450. The recipient of the compressed data may be the same remote system or location as the client, or may be a different location or remote system than the client. Other modification, changes, or further manipulations to the selected data compression candidate may also be performed prior to sending the requested compressed data. For example, in some embodiments, one or more encryption techniques may be applied to the selected data compression candidate. Similarly, another compression technique, such as system compression technique, may be applied to generate multi-level compressed data to send as the requested compressed data.

Elements 410-450 may be performed above repeatedly for different data from multiple different clients. In at least some embodiments, data received may be from the same client and the same type, format, or other similar characteristics of data. Such data may be compressed according to the technique that was previously applied without performing a rules-based analysis, generating one or more data compression candidates, or selecting one of the data compression candidates to send. For example, in some embodiments, received data may be a data stream comprising multiple data chunks. For the first data chunk, elements 410 through 450 may be performed to compress the data chunk. However, for subsequent data chunks of the data stream, each data chunk may be compressed according to the compression technique applied to the first data chunk. Thus, these data chunks may be compressed and sent without performing additional analysis.

Figure 5:
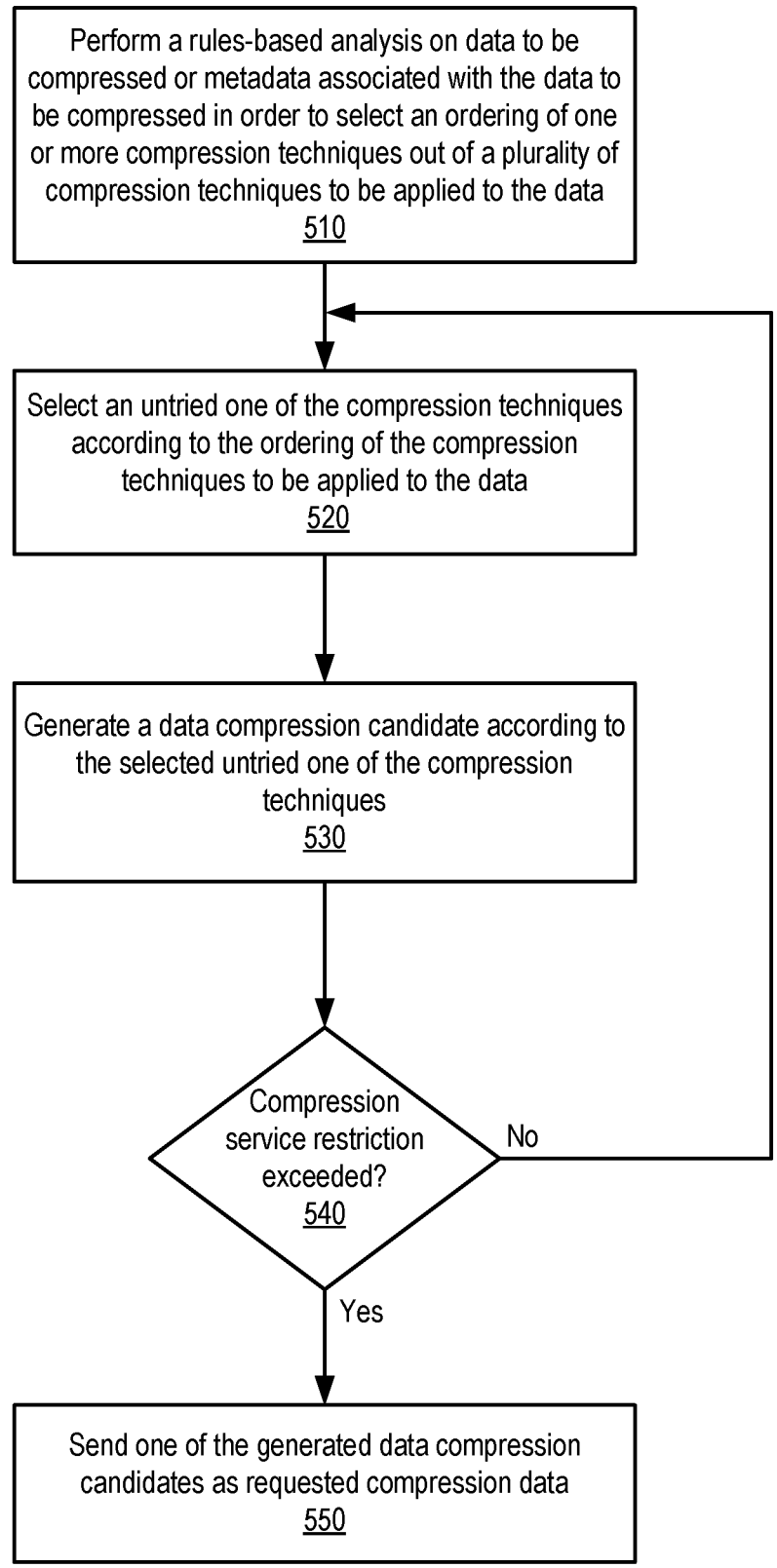
FIG. 5 is a high-level flowchart of a method to generate one or more data compression candidates according to a sequence of selected compression techniques and within a given compression service restriction, according to some embodiments.

Turning now to FIG. 5, in some embodiments, a compression service restriction may be enforced. This service restriction may be combined with the selection of one or more compression techniques in a particular sequence, such that the most efficient data compression candidates may be generated and the compression restriction satisfied. FIG. 5 is a high-level flowchart of a method to generate one or more data compression candidates according to a sequence of selected compression techniques and within a given compression service restriction, according to some embodiments.

As indicated at 510, a rules-based analysis data to be performed or metadata associated with the data to be compressed may be performed to select an ordering of one or more compression techniques out of a plurality of compression techniques to be applied to the data. This sequence may, in some embodiments, represent a priority order or some other indication of the most efficient compression techniques to try. For example, as indicated at 520, an untried compression technique may be selected according to the ordering of compression techniques to be applied to the data. Thus, a data compression technique that is most likely to perform the most efficient compression may be selected first. In some embodiments, most efficient compression may indicate that the compression technique may generate the smallest sized compressed data. A data compression candidate may then be generated according to the selected untried one of the compression techniques, as indicated at 530.

As illustrated in FIG. 5, elements 520 and 530 may be repeated until a compression service restriction is exceeded, as indicated at 540. A compression service restriction, as noted above, may be any form of rule, cap, resource limit, or boundary that may limit the generation of data compression candidates, or another of the functions or components within data compression service 220, such as the entire service performed for given data. For example, in some embodiments, a compression service restriction may be a service fee cap, which limits the generation of compression data candidates to those that may be generated within a certain service fee. Although ordering of compression techniques may be applied serially, such as illustrated in FIG. 5, the ordering of compression techniques may be applied in systems where data compression candidates are generated in parallel. Consider an example system where a particular number of compression engines (e.g., nodes, systems, virtual compute instances, etc. . . . ) may be implemented to generate data compression candidates (such as in accordance with a data compression restriction). The compression techniques to be applied by the data compression engines when generating data compression candidates may be determined via the ordering of compression techniques. Additional compression techniques may be tried as one or more of the currently used compression engines is finished with the generation of a compression data candidate, and thus the compression engines may both operation in parallel as well as generating data compression candidates according to the ordering of compression techniques. As illustrated by the negative exit from 540, when the compression service restriction is exceeded, generation of new data compression candidates may no longer continue. A selection, such as the selection described above at 440 may occur, and the selected compressed data may be sent, as indicated at 550.

Please note, that although the illustrated techniques for applying a compression service restriction and sequence of compression techniques are illustrated together, they may be performed individually or in combination with other methods or techniques, such as those discussed above with regard to FIG. 4.

Turning now to FIG. 6, in some embodiments, a rules-based analysis of data and/or metadata associated with data to be compressed may be modified, updated, or altered based one or more machine learning techniques. FIG. 6 is a high-level flowchart illustrating a method to perform machine-learning to update a rules-based analysis of data to be compressed, according to some embodiments. As indicated at 610 historical compression data for previously compressed data at a compression data service may be obtained. As discussed above with regard to historical compression data 350 in FIG. 3, this historical compression data may include a variety of different data characteristics, performance characteristics, and/or any other data associated with a previous performance of compression for data. For example a history of compressed data for individual clients may be maintained.

One or more machine learning techniques may be performed on the historical compression data to update a current set of compression selection rules, as indicated at 620, to be applied to data characteristics for the data to be compressed. For example, data to be compressed may have a set of data characteristics that includes data type, type of client, and size. Historical compression data for previously compressed data of data with the same or similar characteristics may be obtained. One or more machine learning techniques, such as supervised, unsupervised, or semi-supervised learning may be applied to the historical compression data. The selection rules to be applied to the data based on the leanings identified by the machine learning techniques. For example, it may be determined that certain compression techniques appear to compress data more efficiently for this type of client and size of data even though the known data type may be generally known to be better compressed using a different compression technique. The certain compression techniques may be elevated in priority for selection in the compression selection rules based on this observation from machine learning. As machine-learning is well-known to those or ordinary skill in the art, the previous examples are not intended to be limiting. Then, as indicated at 630, the updated set of compression selection rules may be applied to data characteristics for the data to be compressed select the one or more compression techniques to be applied to the data.

Figure 7:
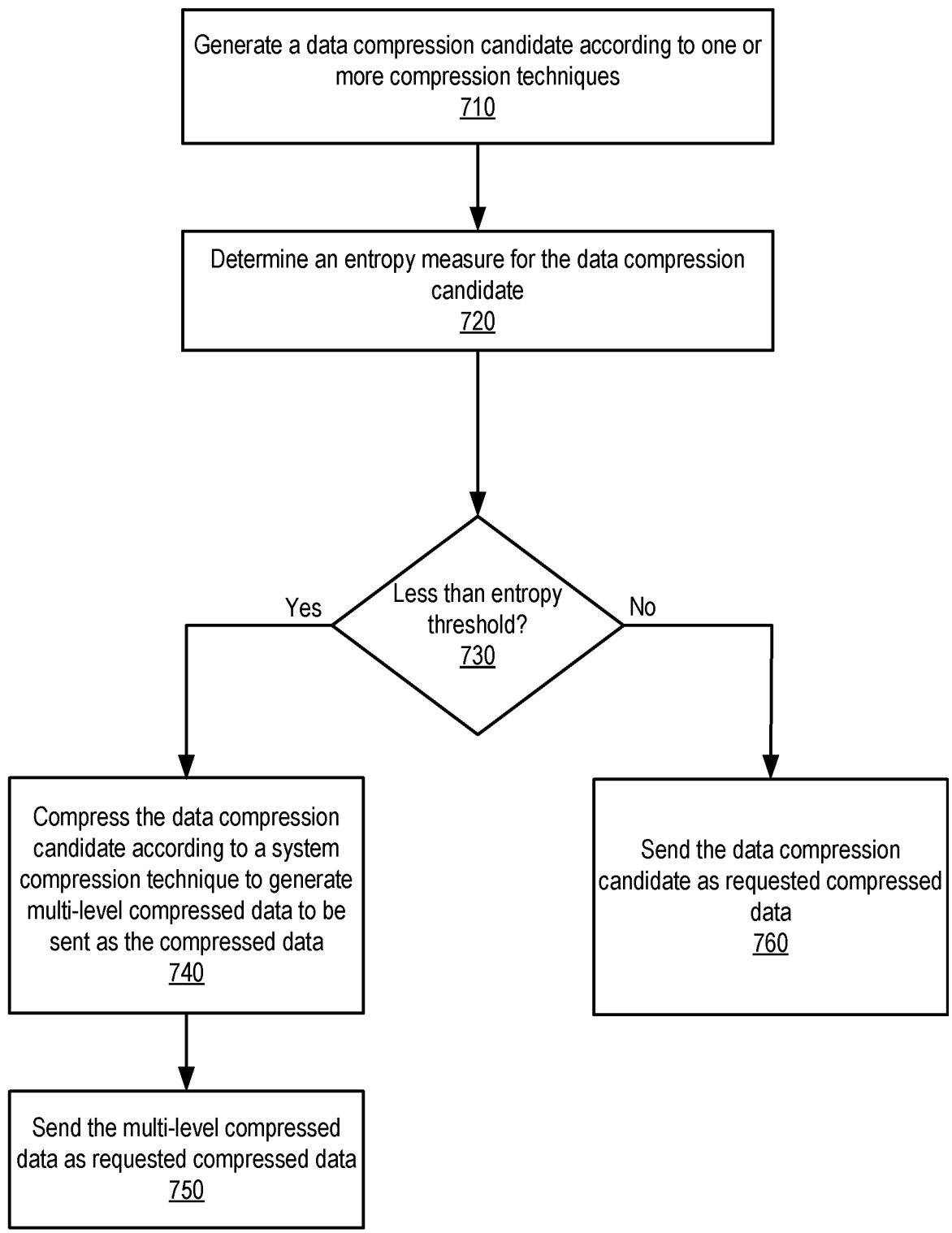
FIG. 7 is a high-level flowchart illustrating a method to perform efficient data compression and analysis as a service including multi-level compression, according to some embodiments.

Turning now to FIG. 7, in some embodiments multi-level compression may be applied to data received for compression. FIG. 7 is a high-level flowchart illustrating a method to perform efficient data compression and analysis as a service including multi-level compression, according to some embodiments. A data compression candidate may be generated according to one or more data compression techniques, as indicated at 710. In some embodiments, this data compression candidate is the selected data compression candidate to be sent as the requested compressed data. An entropy measure may then be determined for the data compression candidate, as indicated at 720. An entropy measure may be determined that indicates the variation in the data values stored in the data compression candidate. It may then be determined, whether the entropy measure of the data compression candidate is less than an entropy threshold, as indicated at 730. If yes, then the data compression candidate may be compressed again according to a system compression technique to generate multi-level compressed data to be sent as the compressed data, as indicated at 740. A system compression technique may be any compression technique, such as those described above with regard to FIGS. 3 and 4. This multi-level compressed data may then be sent, as indicated at 750. Although not illustrated, this multi-level compressed data may be examined to determine if the multi-level compressed size is larger than the previous compressed size, and if so, the multi-level compression may be removed and the data sent, as indicated at 760. Alternatively, if the entropy measure is not less than the threshold, the data compression candidate may be sent as is, such as indicated at 760. However, although FIG. 7 illustrates that an entropy threshold may be applied, in some embodiments all data compression candidates selected as the data to be sent may be compressed using the system-wide compression technique.

As discussed above with regard to FIG. 2, in some embodiments, data compression may be offered as a network-based service to a variety of different clients, such as clients 250*a* through 250*n*. FIG. 8 is a high-level flowchart illustrating a method to perform data compression as a service, according to some embodiments. Various different systems, components, and architectures may utilized to implement the below described techniques. In at least some embodiments, a network-based services platform such as network-based services platform 200 in FIG. 2, may implement some or all of the described elements. However, please note that the examples given below are not intended to be limiting as to any specific architecture, configuration, or component implementing a network-based data compression service. Nor is the particular ordering or arrangement of elements limiting as to any other ordering or arrangement of elements, or the performing of additional elements or removal of elements illustrated in FIG. 8.

As indicated at 810, in some embodiments a compression request from a client indicating data to be compressed may be received. As the various compression requests described above with regard to FIG. 3 and FIG. 7, data to be compressed may be indicated (e.g., the location of the data), included, or sent with the compression request. The compression request may contain one or more identifiers associated with the compression request that identify the client or client account for whom the request is sent. For example, the identifiers may be formatted according to an API or other type of protocol or interface that defines several fields including a requesting client account number. Similarly, other client information may be indicated in the compression request, such as requesting various types of compression services or options offered by the data compression service. For instance, the compression request may identify a specific fee structure for the compression request, which may then determine how compressed data may be generated as well as how a fee associated with the request may be generated. Likewise, a specific type of compression technique, analysis, client history, or any other type of information may be indicated as part of the compression request. For instance, a client may submit the compression request with an option to only rely upon previous client compression requests from the same client to analyze and compress the indicated data.

In various embodiments, a network-based data compression service may offer a variety of different fee structures for compression clients. These fee structures may include one or more determining compression service factors and/or restrictions. Resource constraints, time constraints, and costs constraints, for instance, may, in some embodiments, be one or more compression service factors that are included in a fee structure. For instance, various time constraints may be included in a fee structure that provide an agreed upon completion time for compression requests, such as a conforming to a particular service level agreement (e.g., 2 minutes per requests). Cost constraints, such as fee caps, or other compression service restrictions, such as those discussed above with regard to FIG. 7, may be included as part of a fee structure. Similarly, resource constraints may also be included. For example, a particular number of resources (e.g., nodes) to perform or handle compression requests (e.g., when available, on demand, reserved, or at a particular price).

A fee structure associated with the compression request may then be determined, in various embodiments, as indicated at 820. Determining the fee structure may be performed by identifying the client, such as through one or more identifiers (e.g., an account number) included in the compression request. Other factors, such as the type of data, time the data was sent, metadata included for the particular data, such as the metadata described above with regard to FIG. 4, may also be included and used in a determination for a data compression service. In some embodiments, a data compression service may offer a single fee structure for clients. However, in at least some embodiments multiple fee structures may be determined for different requests from a same client or different clients.

Compressed data may be generated according to the determined fee structure, as indicated at 830. As discussed above with regard to FIGS. 3 and 4, a variety of different compression techniques may be applied to data for a compression request. In at least some embodiments, a compression request may indicate a selected one or more compression techniques to apply to the indicated data. Alternatively, the compression request may, in some embodiments, request one or more of the various analysis techniques described above with regard to FIGS. 3 and 4, such as applying a rules-based or other form of dynamic analysis, informed by machine learning or without machine learning. Similar to the discussion above with regard to FIG. 5, the requested compressed data may be generated according to the determined fee structure. For example, in some embodiments, the determined fee structure may apply a time limit, or resource or fee cap for generating data compression candidates. Similarly, a fee structure may price different compression techniques at different prices, and if a user selected compression technique exceeds a cap or limit determined by a fee structure for the request, then a similar compression technique may be performed instead (or a higher fee generated for using the selected compression technique) for the compression request. More generally, the determined fee structure may, in some embodiments, impose one or more compression service restrictions on the compression request when generating the compressed data. If for instance, a compression service restriction is to only perform the compression request for the client when the cost of compressing the data (e.g., based on the availability of resources such as nodes to perform the request) is at a certain price, then request may be queued until the compression service restriction may be met. As many other different compression service restrictions and types of fee structures may be envisioned, the previous examples are not intended to be limiting.

In at least some embodiments, a fee may be generated for the compressed data according the fee structure, as indicated at 840. For instance, a fee structure may describe certain rates or costs for various factors, such as the time to compress, amount of data to compress, type of data to compress, the number of resources to compress the data (e.g., number of nodes), type of compression technique, etc. . . . . Various fee structures may provide for a certain number of compression requests in a given time period (e.g., 10 daily), or a certain amount of data to be compressed in a certain time period (e.g., 10 gigabytes per month). Additional charges, fees, or prices may be added for the various options or compression services described above, such as dynamic or rules-based analysis of the data. In at least some embodiments, a generated fee may be associated with a client, such as by recording the fee in a data store holding client accounting and billing information, such as described above with regard to network-based services interface 200 in FIG. 2.

The requested compressed data may then be sent according to the compression request, as indicated at 850. As discussed above with regard to FIGS. 3 and 4, the compressed data may be sent to a remote location different from the origin of the data, such as another client, system, or service. For instance, compressed data may be sent to an archival or other durable data store service. Alternatively, compressed data may be sent back to the requesting client.

In some embodiments, decompression requests may be process for a client in a manner similar to that described above in FIG. 8. A fee structure for compression requests may be determined, the data may be decompressed according to the fee structure, a fee for the decompression may be generated, and the decompressed data may be sent according to the compression request.

Example System

Embodiments of efficient data compression and analysis as described herein may be executed on one or more computer systems, which may interact with various other devices. One such computer system is illustrated by FIG. 9. In different embodiments, computer system 1000 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing or electronic device.

In the illustrated embodiment, computer system 1000 includes one or more processors 1010 coupled to a system memory 1020 via an input/output (I/O) interface 1030. Computer system 1000 further includes a network interface 1040 coupled to I/O interface 1030, and one or more input/output devices 1050, such as cursor control device 1060, keyboard 1070, and display(s) 1080. Display(s) 1080 may include standard computer monitor(s) and/or other display systems, technologies or devices. In at least some implementations, the input/output devices 1050 may also include a touch- or multi-touch enabled device such as a pad or tablet via which a user enters input via a stylus-type device and/or one or more digits. In some embodiments, it is contemplated that embodiments may be implemented using a single instance of computer system 1000, while in other embodiments multiple such systems, or multiple nodes making up computer system 1000, may be configured to host different portions or instances of embodiments. For example, in one embodiment some elements may be implemented via one or more nodes of computer system 1000 that are distinct from those nodes implementing other elements.

In various embodiments, computer system 1000 may be a uniprocessor system including one processor 1010, or a multiprocessor system including several processors 1010 (e.g., two, four, eight, or another suitable number). Processors 1010 may be any suitable processor capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

In some embodiments, at least one processor 1010 may be a graphics processing unit. A graphics processing unit or GPU may be considered a dedicated graphics-rendering device for a personal computer, workstation, game console or other computing or electronic device. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, graphics rendering may, at least in part, be implemented by program instructions configured for execution on one of, or parallel execution on two or more of, such GPUs. The GPU(s) may implement one or more application programmer interfaces (APIs) that permit programmers to invoke the functionality of the GPU(s). Suitable GPUs may be commercially available from vendors such as NVIDIA Corporation, ATI Technologies (AMD), and others.

System memory 1020 may be configured to store program instructions and/or data accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above are shown stored within system memory 1020 as program instructions 1025 and data storage 1035, respectively. In other embodiments, program instructions and/or data may be received, sent or stored upon different types of computer-accessible media or on similar media separate from system memory 1020 or computer system 1000. Generally speaking, a computer-accessible medium may include storage media or memory media such as magnetic or optical media, e.g., disk or CD/DVD-ROM coupled to computer system 1000 via I/O interface 1030. Program instructions and data stored via a computer-accessible medium may be transmitted by transmission media or signals such as electrical, electromagnetic, or digital signals, which may be conveyed via a communication medium such as a network and/or a wireless link, such as may be implemented via network interface 1040.

In one embodiment, I/O interface 1030 may be configured to coordinate I/O traffic between processor 1010, system memory 1020, and any peripheral devices in the device, including network interface 1040 or other peripheral interfaces, such as input/output devices 1050. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. In addition, in some embodiments some or all of the functionality of I/O interface 1030, such as an interface to system memory 1020, may be incorporated directly into processor 1010.

Network interface 1040 may be configured to allow data to be exchanged between computer system 1000 and other devices attached to a network, such as other computer systems, or between nodes of computer system 1000. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1050 may, in some embodiments, include one or more display terminals, keyboards, keypads, touchpads, scanning devices, voice or optical recognition devices, or any other devices suitable for entering or retrieving data by one or more computer system 1000. Multiple input/output devices 1050 may be present in computer system 1000 or may be distributed on various nodes of computer system 1000. In some embodiments, similar input/output devices may be separate from computer system 1000 and may interact with one or more nodes of computer system 1000 through a wired or wireless connection, such as over network interface 1040.

Figure 9:
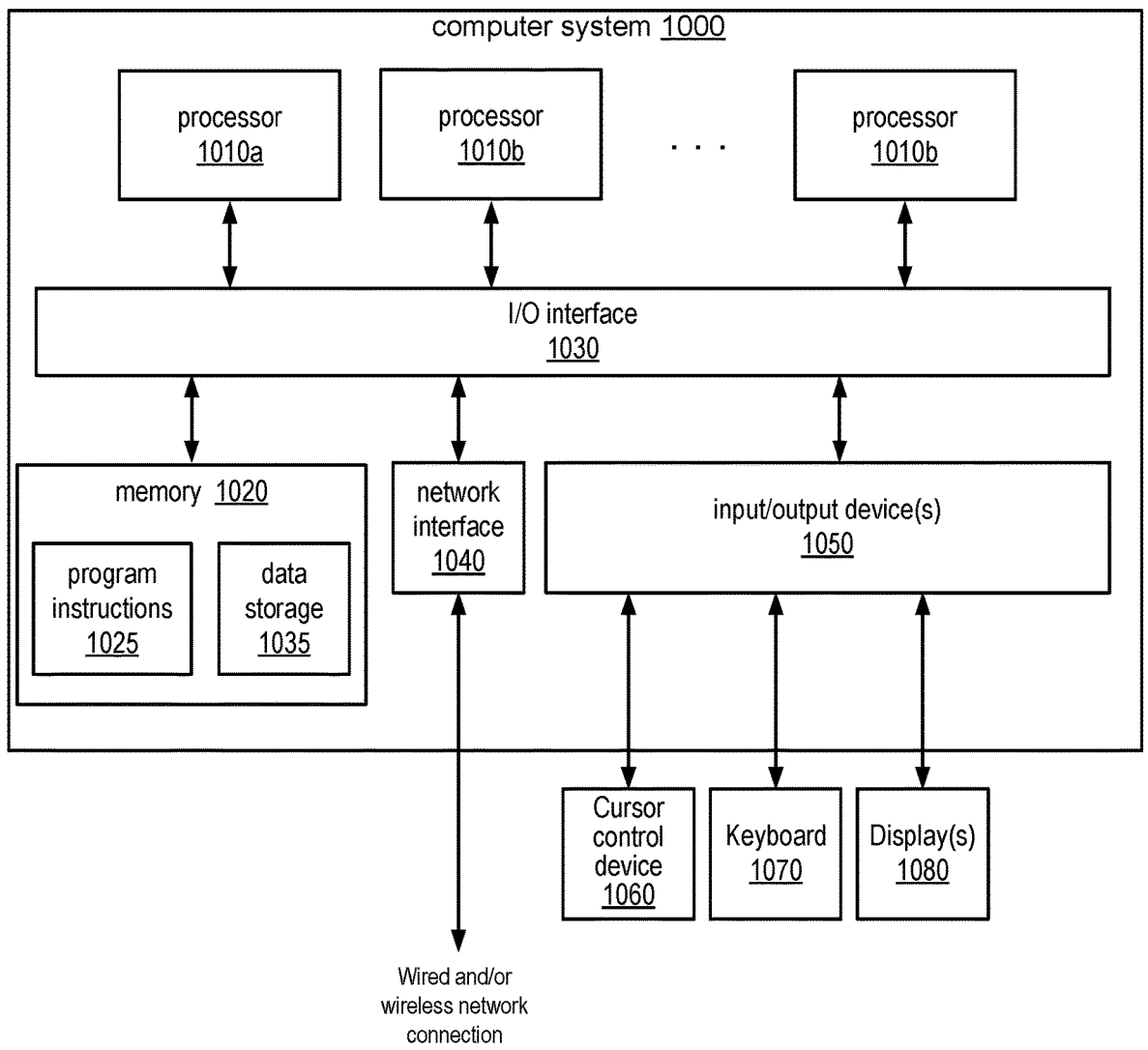
FIG. 9 illustrates an example system, according to some embodiments.

As shown in FIG. 9, memory 1020 may include program instructions 1025, configured to implement the various embodiments of efficient data compression and analysis as a service as described herein, and data storage 1035, comprising various data accessible by program instructions 1025. In one embodiment, program instructions 1025 may include software elements of embodiments as described herein and as illustrated in the Figures. Data storage 1035 may include data that may be used in embodiments. In other embodiments, other or different software elements and data may be included.

Those skilled in the art will appreciate that computer system 1000 is merely illustrative and is not intended to limit the scope of the embodiments as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-readable medium separate from computer system 1000 may be transmitted to computer system 1000 via transmission media or signals such as electrical, electromagnetic, or digital signals, conveyed via a communication medium such as a network and/or a wireless link. This computer readable storage medium may be non-transitory. Various embodiments may further include receiving, sending or storing instructions and/or data implemented in accordance with the foregoing description upon a computer-accessible medium. Accordingly, the present invention may be practiced with other computer system configurations.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A system, comprising:
a memory storing program instructions executable by at least one processor to cause the at least one processor to perform a method to at least:
receive, via an interface for a network-based compression service, data to be compressed;
responsive to receipt of the data to be compressed:
try two or more compression techniques of a plurality of different compression techniques implemented by the network-based compression service to generate two or more compressed candidates at the network-based compression service to select one of the two or more compressed candidates that meets or exceeds compression criteria for the data, wherein each compressed candidate is a compressed version of the received data, and the two or more compression techniques are tried until a restriction for the network-based compression service is met, the restriction being different from the compression criteria; and
send the selected compressed candidate to a recipient.

2. The system of claim 1, wherein at least one of the compression techniques that generates one of the compressed candidates is a multi-level compression technique.

3. The system of claim 1, wherein the program instructions further cause the at least one processor to perform the method to at least determine an order for the plurality of compression techniques to try to compress the data, wherein the two or more compression techniques are tried according to the determined order.

4. The system of claim 1, wherein the program instructions further cause the at least one processor to perform the method to at least:
responsive to a request to compress another data, obtaining the Fequested other data requested to be compressed from a different network-based service than the network-based compression service.

5. The system of claim 1, wherein the compression criteria are evaluated according to an entropy threshold.

6. The system of claim 1, wherein the data to be compressed is received from a client application that is different than the recipient.

7. A method, comprising:
receiving, via an interface for a network-based compression service, data to be compressed;
responsive to receipt of the data to be compressed:
trying two or more compression techniques of a plurality of different compression techniques implemented by the network-based compression service to generate two or more compressed candidates at the network-based compression service to select one of the two or more compressed candidates that meets or exceeds compression criteria for the data, wherein each compressed candidate is a compressed version of the received data, the two or more compression techniques are tried until a restriction for the network-based compression service is met, the restriction being different from the compression criteria; and
sending the selected compressed candidate to a recipient.

8. The method of claim 7, wherein at least one of the compression techniques that are tried to generate the compressed candidates is a multi-level compression technique.

9. The method of claim 7, further comprising determining an order for the plurality of compression techniques to try to compress the data, wherein the ee two or more compression techniques are tried according to the determined order.

10. The method of claim 7, wherein the receiving the data to be compressed comprises, obtaining the data to be compressed from a different network-based service than the network-based compression service.

11. The method of claim 7, wherein the compression criteria for the compressed candidates are evaluated according to an entropy threshold.

12. The method of claim 7, wherein a request to compress the data is received from a client application that is different than the recipient, the request received prior to the receiving the data.

13. A non-transitory, computer-readable storage medium, storing program instructions that when executed by one or more computing devices cause the one or more computing devices to implement:
responsive to receiving, via an interface for a network-based compression service, data to be compressed:
trying two or more compression techniques of a plurality of different compression techniques implemented by the network-based compression service to generate two or more compressed candidates at the network-based compression service to select one of the two or more compressed candidates that meets or exceeds compression criteria for the data, wherein each compressed candidate is a compressed version of the received data, and the two or more compression techniques are tried until a restriction for the network-based compression service is met, the restriction being different from the compression criteria; and
sending the selected compressed candidate to a recipient.

14. The non-transitory, computer-readable storage medium of claim 13, wherein at least one of the compression techniques that generate the compressed candidates is a multi-level compression technique.

15. The non-transitory, computer-readable storage medium of claim 13, wherein the program instructions cause the one or more computing devices to further implement determining an order for the plurality of compression techniques to try to compress the data, wherein the ene two or more compression techniques are tried according to the determined order.

16. The non-transitory, computer-readable storage medium of claim 13, wherein the program instructions cause the one or more computing devices to further implement:
obtaining the data to be compressed from a different network-based service than the network-based compression service.

17. The non-transitory, computer-readable storage medium of claim 13, wherein the compression criteria for the compressed candidates are evaluated according to an entropy threshold.

* * * * *